United States Patent [19]

Baldi

[11] Patent Number: 4,824,482
[45] Date of Patent: Apr. 25, 1989

[54] PYROPHORIC IRON PRODUCT AND PROCESS OF MAKING

[75] Inventor: Alfonso L. Baldi, Wynnewood, Pa.

[73] Assignee: Alloy Surfaces Company, Inc., Wilmington, Del.

[21] Appl. No.: 707,656

[22] Filed: Mar. 4, 1985

Related U.S. Application Data

[63] Continuation-in-part of Ser. No. 685,910, Dec. 27, 1984, Ser. No. 632,016, Jul. 18, 1984, abandoned, Ser. No. 584,538, Feb. 28, 1984, Ser. No. 571,510, Jan. 17, 1984, Pat. No. 4,537,927, Ser. No. 554,441, Nov. 22, 1983, abandoned, Ser. No. 488,103, Apr. 25, 1983, Pat. No. 4,615,920, and Ser. No. 281,405, Jul. 8, 1981, Pat. No. 4,708,913, said Ser. No. 584,538, Ser. No. 554,441, and Ser. No. 488,103, each is a continuation-in-part of Ser. No. 417,214, Sep. 13, 1982, abandoned, and Ser. No. 172,671, Jul. 28, 1980, Pat. No. 4,435,481, said Ser. No. 281,405, is a continuation-in-part of Ser. No. 172,671.

[51] Int. Cl.$^4$ .............................. B22F 1/00
[52] U.S. Cl. ...................... 75/254; 75/251; 106/1.05; 106/1.11; 156/664; 156/665; 428/615; 428/651; 428/652; 428/653; 502/207; 502/301; 502/337; 502/338
[58] Field of Search ............ 502/301, 338, 337, 207; 106/1.05, 1.11; 428/615, 652, 653, 651; 75/254, 251; 156/665, 664

[56] References Cited

U.S. PATENT DOCUMENTS

| | | | |
|---|---|---|---|
| 3,519,575 | 7/1970 | Bozik et al. | 502/337 |
| 3,809,658 | 5/1974 | Csuros et al. | 502/301 |
| 4,290,391 | 9/1981 | Baldi | 428/653 |
| 4,349,612 | 9/1982 | Baldi | 149/15 |
| 4,435,481 | 3/1984 | Baldi | 502/301 |
| 4,443,557 | 4/1984 | Baldi | 502/301 |
| 4,464,480 | 8/1984 | Windawi et al. | 502/207 |
| 4,615,920 | 10/1986 | Baldi | 428/652 |
| 4,694,036 | 9/1987 | Baldi | 524/472 |
| 4,708,913 | 11/1987 | Baldi | 149/5 |

FOREIGN PATENT DOCUMENTS

| | | | |
|---|---|---|---|
| 0603191 | 8/1960 | Canada . | |
| 0708934 | 5/1965 | Canada | 502/207 |

*Primary Examiner*—Stephen J. Lechert, Jr.
*Attorney, Agent, or Firm*—Connolly & Hutz

[57] ABSTRACT

Diffusion aluminizing, when applied to titanium is effected with little or no activator to produce more uniform case and less etching.

Workpieces are very rapidly pack-diffusion coated by using an excess of energizers in the pack, heating the retort containing the packed workpieces at a rate that brings the workpieces to diffusion-coating temperature and then completing the diffusion coating, all in less than 50 minutes, then cooling the retort.

Diffusion aluminizing can also be applied to foils and powder to make pyrophoric product after leaching out much of the introduced aluminum. Powder can also be diffusion boronized. Pyrophoric boron-containing iron or nickel powder mixed with Ba(NO$_3$)$_2$ will ignite to cause generation of large quantity of NO$_2$ gas, and generation is improved when powdered boron and/or an oxidizer like NaClO$_3$ is added. Pyrophoric articles containing substantial alloyed boron can be placed in good thermal contact with cool heat sink and exposed to air to stabilize them so that they do not begin to pyrophorically react unless heated to over 70° C. Magnesium powder mixed with powdered boron and Ba(NO$_3$)$_2$ makes explosive composition.

9 Claims, No Drawings

PYROPHORIC IRON PRODUCT AND PROCESS OF MAKING

This application is in part a continuation of applications:
Ser. No. 685,910 filed Dec. 27, 1984
Ser. No. 632,016 filed July 18, 1984, abandoned
Ser. No. 584,538 filed Feb. 28, 1984
Ser. No. 571,510 filed Jan. 17, 1984 (U.S. Pat. No. 4,537,927 granted Aug. 27, 1985)
Ser. No. 554,441 filed Nov. 22, 1983 (subsequently abandoned)
Ser. No. 488,103 filed Apr. 25, 1983, U.S. Pat. No. 4,615,920 granted Oct. 7, 1986
Ser. No. 281,405 filed July 8, 1981 (U.S. Pat. No. 4,708,913 granted Nov. 24, 1987)

The '538, '441 and '103 applications are in turn continuations-in-part of Ser. No. 417,214 filed Sept. 13, 1982, subsequently abandoned, and of Ser. No. 172,671 filed July 28, 1980 now U.S. Pat. No. 4,435,481 granted Mar. 6, 1984. The '405 application is also a continuation-in-part of the '671 application.

The present invention relates to the diffusion coating of metal substrates and to activated metals that can be made with the help of such coatings.

Among the objects of the present invention is the provision of improved techniques and products of the foregoing types.

The foregoing as well as additional objects of the present invention will be more fully understood from the following description of several of its exemplifications.

According to the present invention improved aluminizing is provided for titanium substrates such as titanium blades for jet engines. Thus the forming of a 0.2 mil to 0.5 mil thick aluminized case by the following techniques provides a high degree of protection that does not appear to detract from the strength of the substrate and does not require the use of top coatings such as described in Ser. No. 554,441 or Ser. No. 632,016. Such top coatings can, however, be applied with advantage over the thus-aluminized titanium, even when the aluminized case is about 2 mils thick.

EXAMPLE I

Jet engine compressor blades made of titanium alloy Ti-6Al-4V are cleaned by blasting with glass or alumina frit and then aluminized in a pre-fired diffusion coating pack having 20% powdered aluminum by weight, the balance powdered alumina. The pre-firing was conducted at 1300° F. for ten hours without a workpiece with the pack held in an inconel retort under an argon atmosphere and with ½% anhydrous aluminum chloride added by weight of the pack. After the pre-firing the pack can be permitted to cool, the retort opened, and the pack transferred to a fresh retort where the titanium blades are embedded in it as the fresh retort is loaded. No aluminum chloride or other energizer is added to the fresh retort.

The diffusion aluminizing step is also conducted at 1300° F. for ten hours in an argon atmosphere. After cool-down the blades are removed from the pack and are found to have an aluminized case uniformly about one mil thick. They do not need further protection except for the most severe uses in which event they can be top coated with several layers of the teflon-containing magnesium-chromate-phosphate coating of U.S. Pat. No. 3,948,687 to build the top coating thickness up to about 0.5 mil. After each layer the coated blade is baked at 650° F. for thirty minutes and the final product after cleaning showed exceptional resistance to corrosion with or without a machine burnishing.

Top coatings containing powdered and/or flake aluminum can also be used.

Similar good corrosion resistance is obtained with other titanium alloys containing at least about 80% titanium, such as Ti-6Al-2Sn-4Zn-6Mo, and even with pure titanium. In general, the aluminizing should be conducted at temperatures below 1600° F., to avoid crystallographic changes that weaken the titanium. Also, unless the aluminizing temperature is at least as high as 1000° F., the aluminum case produced by the foregoing technique is less than 0.5 mil thick even after prolonged heating times.

In the foregoing example a very small amount of chloride can be detected in the pre-fired pack after the pre-firing. If the usual ½% $AlCl_3$ is added to the pre-fired pack after the pre-firing so that it is present during the diffusion coating heat, the aluminized case that forms is very irregular in thickness and can have a maximum thickness of two mils or more. In addition, the aluminized surface is of etched appearance so that its strength and other physical characteristics suffer. Similar undesirable results are obtained with ammonium chloride or ammonium bifluoride energizers in the diffusion coating heat, although these can be satisfactorily used in the pack pre-firing operation when no energizer is added for the diffusion coating heat.

An energizer like anhydrous water-insoluble $CrCl_3$ has less of an undesirable effect, yet will speed the diffusion coating step when present in about ½% or higher concentration on the diffusion coating pack. Titanium halides are even better but are very volatile and more awkward to use.

Diffusion aluminizing of the titanium blades of the foregoing example with the diffusion coating pack not pre-fired, or pre-fired without added energizer, also provides satisfactory and uniform aluminized cases, although the diffusion coating speed is somewhat reduced. As in the prior aluminizing art, the aluminum content of the diffusion coating pack can be as low as about 2% by weight, or as high as about 60% by weight, and other inert diluent powders such as kaolin can be used in place of the alumina diluent.

The aluminized titanium products of the present invention with aluminized cases 0.2 to 2 mil thick cases are exceptionally hard, at least Rockwell C-50, with the case essentially $TiAl_3$ together with whatever alloying ingredients were originally present in the titanium substrate. These alloying ingredients preferably total not over 20% of the substrate.

Substituting for the aluminum in the pack an aluminum alloyed with 12% silicon speeds up the diffusion aluminizing so that a diffusion case about 0.5 mil thick is produced even at 1000° F. and a 2 mil thick case at 1300° F. These cases also are essentially $TiAl_3$ and exceptionally hard. No substrate etching is found and very little of the silicon transfers to the case. With such a substituted pack a 0.2 mil hard aluminized case is formed at temperatures as low as 885° F. using a diffusion coating process otherwise as in Example I. This is the minimum case thickness desired. As noted, the diffusion aluminizing with or without the silicon in the pack aluminum is also speeded by using $TiCl_2$ or other titanium halide as the energizer, in concentrations of ¼% to ⅜% of the diffusion coating pack. Such energizers do not cause significant etching of the titanium substrate. Where the titanium halide vaporizes very readily it can be added to the pack in a frangible or fusible container that ruptures or melts at an elevated temperature below the diffusion temperature. Alternatively, the titanium-halide-energized pack can be used to diffusion coat in a so-called glass-sealed retort as in U.S. Pat. No. 2,851,375.

The presence of about 1% to about 10% titanium powder distributed through the diffusion coating pack helps keep the titanium substrate from excessive loss of strength.

The total time at diffusion temperature need not be over about 14 hours and, as noted, at least about a 0.2 mil TiAl$_3$ case thickness should be present to give the desired high hardness and significant durability. The titanium substrate to be diffusion coated can have a titanium content of as little as 80% or preferably at least 90% by weight, with the usual alloying ingredients such as vanadium, aluminum, silicon, and the like.

Titanium workpieces can also be protected by carburizing and/or boronizing as described in U.S. Pat. Nos. 3,787,223 and 3,787,245. This type of protection is promoted by top coatings of the aluminum-particle-containing compositions. The magnesium chromate of such top coating compositions is their key bonding ingredient regardless of the nature of the surface it coats inasmuch as magnesium chromate in the absence of all phosphorus compounds generally used with it, yields results only slightly poorer than those obtained with the help of the phosphorus compounds. Aluminum, calcium and zinc chromates are not as desirable as magnesium chromate for the maximum high-temperature protection, and are best used only with their phosphorus compounds.

The aluminized titanium substrates do not show the roughness described in Ser. No. 488,103 for age-hardenable stainless steels. The top coatings referred to in that parent application can also be applied with advantage to aluminized titanium or other substrates.

Aluminizing of titanium or any other substrate can be effected in very short times by specially heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a 2 mil aluminized case is produced only about 30 minutes after starting to heat an iron or steel workpiece to 1800° F. in a pack of:

10 parts by weight—Aluminum powder about 100 microns in size
45 parts by weight—Chromium powder about 10 microns in size
50 parts by weight—Al$_2$O$_3$ about 100 microns in size with 0.5% NH$_4$Cl mixed in and based on the weight of the pack, if the workpiece reaches 1800° F. in 15 minutes.

It is preferred to have the workpiece covered by no more than about ¼ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7-inch length and a 2-inch diameter, so that about ½-inch pack thickness envelopes the workpiece, heat supplied at the rate of at least about 200,000 BTU per hour per pound of workpiece will effect the desired heat-up to temperatures as high as 1800° F. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼ inch of the retort as described in U.S. Pat. No. 3,824,122. Indeed, the presence of a ½-inch thick pack covering is preferred when practicing the rapid diffusion coating of the present invention inasmuch as it assures the presence of sufficient energizer even when the energizer content of the pack is only 0.5% or less by weight. The energizer content can be increased, for example, to 1% or 2%, and where the workpiece contains a narrow passageway the wall of which is to be diffusion coated as in U.S. Pat. No. 4,347,267, the passageway can be filled or have its wall coated with a diluent-free mixture of activator and the metal to be coated on the wall.

A retort packed in accordance with the rapid diffusion coating technique of the present invention can contain a number of workpieces. There is no need to position each workpiece into its own carefully dimensioned closely fitting retort as in U.S. Pat. No. 3,824,122.

Diffusion coating at temperatures no higher than about 1000° F., as in diffusion aluminizing, is even more readily accomplished in short periods of time—not over 45 minutes of heating is generally needed to bring the workpieces to temperature and obtain an aluminized case at least 1 mil thick. Thinner cases require only about 30 minutes or even less. Zinc and aluminum can both be very effectively and very rapidly diffusion coated onto other metals at the foregoing low temperatures.

To further save time the cooling of the diffusion coating retort is best effected by withdrawing it from the furnace in which the heating is carried out. Exposed to the ambient air and with the help of the flushing gas stream between the work-holding retort and an outer retort, the cylindrical retort assembly described above cools in about 15 minutes to the point that the outer retort can be opened and the inner retort withdrawn, exposed to the atmosphere and emptied. In this way the entire diffusion coating sequence including the completion of the cool-down takes only about an hour or 65 minutes. This compares with the 1½ hours disclosed in U.S. Pat. No. 3,824,122 for just the heating time. The cool-down can also be accelerated by blowing air over the cooling retort assembly or by lowering it into a quenching liquid such as water.

U.S. Pat. No. 3,117,846 suggests a powder pack diffusion heating for one-half hour, but that time does not include the time needed to bring the powder pack and the workpiece to the diffusion coating temperature. Such heat-up time is generally a number of hours if the continuous treatment technique of U.S. Pat. No. 3,824,122 is not used.

Pack chromizing is generally not conducted at temperatures below about 1100° F., so that it cannot be completed as rapidly as the most rapid pack aluminizings. However, a 300° F. or 400° F. increase in diffusing temperature only takes about 5 minutes longer to attain by the foregoing rapid heat-up technique.

The diffusion coating packs can be prepared by mixing together the individual pure ingredients, or from other sources such as scrap materials that contain one or more of the desired ingredients. Thus, chromium hydroxide sludges precipitated from used chromium plating or anodizing or leather tanning baths, are difficult to dispose of without creating environmental problems. A similar problem is faced by sludges from used nickel, cobalt and copper plating solutions, and from iron-loaded pickling rinses. Such sludges are, however, readily converted to pack diffusion ingredients as by drying and then reacting them with metallic magnesium, as described in U.S. Pat. No. 3,801, 357, French Pat. No. 1,123,326 and French Addition Pat. No. 70,936. Such treatment converts chromium hydroxide to metallic chromium, while the magnesium is converted to magnesium oxide which acts as inert refractory diluent for the metallic chromium when the mixture is used as a diffusion chromizing pack.

The presence of aluminum hydroxide and other insoluble heavy metal compounds in the sludge need not interfere with the use of the magnesium-reacted product as a diffusion coating pack. A relatively large content of iron can, for example, be tolerated where the articles to be diffusion chromized have a substantial iron content. Most metals to be diffusion-coated are alloys containing many ingredients, and the presence of the corresponding ingredients in the diffusion coating packs in small amounts does not create problems. It is generally preferred that the contaminating metals be present in the sludge at a concentration less than 20% based on the total weight of the metal in the sludge. For this computation, only the metal portion of the compounds in the sludge are considered.

To minimize expense the content of metallic magnesium after the magnesium treatment is best kept quite low, as by using a stoichiometric or less than stoichiometric proportion of magnesium for that treatment, or by vacuum evaporating any residual magnesium metal to recover it. Insufficient magnesium will leave a little unreacted oxide of the sludge metal in the reduced mixture, but this metal oxide does no harm where the same metal is being diffusion coated. Indeed, a little dried but otherwise untreated sludge can be added to a used diffusion coating pack to make up for the metal that has diffused out. During the course of the next diffusion coating run with that replenished pack, some or all of the added metal hydroxide is converted to metal by the halide-containing hydrogen generally used as the diffusion coating atmosphere.

Excess magnesium in the sludge-reduction can also be tolerated. Some excess will evaporate off during the sludge-reducing heat but 1% to 2% residual magnesium in a chromizing pack is helpful and improves the chromized product.

The reducing action of the magnesium is effected by magnesium vapor, and the reducing step is generally conducted at a temperature of from about 1400° F. to about 2000° F. in an inert or reducing atmosphere. The mixture resulting from the reducing reaction ordinarily has its components so tightly held to each other mechanically that they are difficult or impossible to separate by mechanical treatment. According to the present invention, however, no such separation is needed.

The following is an illustrative example:

EXAMPLE II

A chromium hydroxide sludge containing about 4% iron and 5% aluminum, based on the weight of its total metal content, has its pH adjusted to between 8 and 9 with ammonia or acetic acid, and is then dried at 250° F. The resulting cake is ground and 900 grams of the ground product is poured over a 500-gram mass of magnesium in a steel pipe retort which is then loosely covered and placed in an outer retort having inlet and outlet lines for supplying it with a controlled atmosphere.

The retorts are then heated to 1600° F. and kept within plus or minus 50° F. from that temperature for 10 hours, while a stream of argon is flushed through the outer retorts. At the end of that time period the retorts are cooled to room temperature, the argon flow then stopped, and the reacted product removed. It is a very fine mixture of magnesium oxide powder and reduced metal.

That mixture is then used as a pack chromizing powder to chromize a 1010 steel rod. About ½% by weight NH$_4$Cl is first added to and distributed through the mixture, and the resulting material used to pack the steel rod in a diffusion coating retort. The diffusion heat is conducted as described in U.S. Pat. No. 3,801,357 at 1900° F. for 12 hours. After cool-down, the chromized rod shows a high quality chromized surface. The small amount of aluminum originally in the sludge is apparently not effective to detract from the quality of the diffusion coating, and neither is its iron content.

Instead of using the magnesium-reduced sludge for a pack that causes its metal content to diffuse into a workpiece, it can be used as a masking mixture that prevents such diffusion coating. This is demonstrated in the following example:

EXAMPLE III

A concentrated sludge from the precipitation with soda ash of the nickel salts in a used nickel plating rinse bath is neutralized, dried and reacted with half its weight of magnesium as in Example II to produce a nickel-bearing powder. This powder is then slurried in a solution of ethyl methacrylate in methyl chloroform as described for the top masking layer in Example I of U.S. Pat. No. 4,208,453, and the slurry used in the aluminizing process of that Example. A very good masking is obtained.

Metallic aluminum is not as volatile as and does not behave like magnesium to effect the sludge reduction. Molten aluminum does reduce chromium oxide with which it comes into contact but the reduced metal tends to dissolve in or alloy with the molten aluminum and thus dilute the reducing action, eventually bringing it to a halt. A similar difficulty is also experienced with nickel oxide reduction, but not with iron oxide reduction.

Sludges of low-melting metals like aluminum, zinc and cadmium can be reduced with magnesium to also produce products useful for diffusion. Some oxides like zinc and aluminum oxides are more difficult for magnesium to reduce, and when present in chromium sludge, for example, will generally not be completely reduced, particularly if no excess of magnesium is used. This feature can be utilized to decrease the content of such difficulty reduced metals in a sludge containing more readily reduced materials that are of primary interest.

The foregoing very rapid diffusion coating technique is particularly suited for preparing pyrophoric articles such as the foils described in U.S. Pat. No. 4,292,208. A mass of such articles can be mixed up with the diffusion coating powder and very quickly aluminized as a batch. The aluminized articles can then be sifted away from the powder and leached to remove enough aluminum to make them pyrophoric.

The caustic concentration in the leaching solution can vary from a saturated solution of KOH to a solution having as little as 5% NaOH. The more concentrated solutions leach more vigorously and thus tend to heat themselves up more rapidly, so that more careful cooling is needed unless the volume of leaching solution is so large compared to the metal surface being leached, that the solution cannot be overheated by the exothermic leaching reaction.

By activating only one face of a foil, as described for example in Ser. No. 172,671, the activation can be made to penetrate most of the way through the foil thickness, leaving only about 20% of that thickness as a structural backbone. The unactivated face of the foil can be plated with aluminum to improve its radar reflection characteristics. The so-called Schoop aluminizing with a spray of molten aluminum is effective to deposit an aluminum film only about 0.1 to 0.3 mils thick on the back of a roll of activated foil as it is unspooled and then respooled in an argon box. A layer of copper or even silver can be similarly deposited in place of the layer of aluminum. Copper and silver are not attacked by leaching baths, so that they can be deposited before or after the leaching.

The radar reflectivity associated with pyrophoric foils is also increased by mixing them with standard aluminum radar chaff or foils. Such aluminum foils only about ½-mil thick or thinner, mixed with 2 to 5 times as many pyrophoric 1-inch discs of iron foil, make an effective heat and radar decoy when ejected as a mass from an exploding cartridge.

The aluminizing and leaching sequences can be used to provide a porous metal surface that better receives coatings, regardless of pyrophoricity. Thus, a jet engine hot section turbine blade made of B-1900 superalloy can be heavily aluminized at about 1100° F. to form an aluminized case 2 to 4 mils thick, after which the treated blade is subjected to boiling 30% NaOH in water for 12 hours to leach out most, if not all of the aluminum from the case. The blade surface is now very porous and can be kept under water to prevent pyrophoric reaction with air.

The porous-surfaced blade is now dipped into an aqueous 1% solution of platinum chloride and absorbs a substantial quantity of the platinum chloride in its pores. The resulting blade dried in an inert atmosphere or still wet is now inserted in a diffusion aluminizing retort and subject to chromaluminizing at about 1800° F. for about 6 hours, as described in U.S. Pat. No. 3,801,357, or to corresponding simple aluminizing as described in U.S. Pat. No. 4,347,267. The final blade has a surface, the outer 2 to 4 mils of which contain platinum and aluminum in quantities that provide considerable resistance against high temperature attack by engine combustion products. Because the last diffusion coating is effected at a temperature which decomposes the platinum chloride into its elements, the platinum in the final blade is in metallic form and is quite uniformly distributed, probably as a platinum aluminide.

Other metals such as rhodium and other platinum family metals can be similarly impregnated relatively deeply into a workpiece. The coating of other nickel-base superalloys as well as of cobalt-base superalloys can be improved by the foregoing preliminary porosity-treatment sequence and diffusion coatings of chromium or other metals can be substituted for or added to the final aluminizing or chromaluminizing.

Metals like yttrium, hafnium and lanthanum that have protective oxides can be correspondingly impregnated in the form of a decomposable soluble salt like the sulfate or nitrate, and a workpiece thus impregnated heated to decompose the salt to oxide, and then diffusion aluminized or chromaluminized or chromized.

Very finely divided protective metals such as the MCrAlY, MCrAlHf and MCrAlZr alloys known in the art, but having particle sizes of about one micron or less can also be absorbed into the foregoing porous workpiece surfaces from dispersions in a liquid such as water, and then sintered in place by heat treatment that preferably effects at least a little diffusion into the surrounding metal. A final aluminizing or chromaluminizing or chromizing, which can be combined with the sintering step, acts to fill in the residual porosity remaining after the impregnating step.

The foregoing porosity is more effective than the porosity obtained by the partial surface depletion described in U.S. Pat. No 4,041,196.

Aluminizing can be used with a subsequent leaching to prepare pyrophoric foils of the nickel or iron, as described above, and even to correspondingly prepare pyrophoric metal powder. Such pyrophoric powder can alternatively be prepared by leaching aluminum or zinc out of a crushed alloy of these metals with iron, nickel or the like. The resulting pyrophoricity can be used to trigger exothermic reactions to greatly increase the thermal output. Thus, pyrophoric iron powder made from iron-aluminum alloy also containing as little as 2% to 6% boron, generates much more heat and reaches temperatures as high as 2000° F. Such powders can be mixed with other readily ignited materials of high-heat output, as for example, powdered magnesium, lithium, boron, aluminum, titanium, carbon, silicon, uranium—preferably depleted from U-235 separation, molybdenum, tungsten, tantalum, vanadium, thorium, zirconium, beryllium and osmium. The mixed powders can be held together with a small amount of binder or can be compressed into discs or the like, and should contain sufficient pyrophoric metal to heat all of the mixture to ignition, and at least about 50% by weight is preferred.

The powder can be compressed with the help of metal honeycombs or screens as described in U.S. patent application Ser. No. 643,782 filed July 17, 1984.

Such a pyrophoric powder or powder mixture can be used as a thermal decoy against heat-seeking missiles, as by projecting them into the air from a sealed container. They can, for example, be compressed or bonded into discs or rods and projected in that form. Such decoy materials can also be given radar chaff characteristics, as by inserting them into thin-walled aluminum or copper tubes about an inch, long or longer—for example, 6 to 8 inches. A quantity of such powder having particles about 20 microns or less in size can be extruded with the help of a polyethylene or polystyrene binder into elongated rods about 7 to 15 mils thick, and the rods wrapped in a turn of aluminum foil ½ to 2 mils thick. The wrap can be held in place by the binder, using heat or solvent to cause it to adhere to the extruded rod or to a small overlap of the wrap. Cutting such a wrapped assembly into suitable lengths, preferably leaving the cut ends open so that air can get to the powder within the wrap, can complete the production, but care should be taken to conduct all of the steps while the powder is protected as by a film of water, from contact with oxygen.

Instead of or in addition to the open ends of the cut lengths, the wrap itself can be perforated to permit more ready access of air to the wrapped powder. On the other hand, such access can be hindered by increasing the proportion of binder to powder, and/or impregnating the powder particles with colloidal inert particles as described in Ser. No. 281,405 or with slowly volatilized liquids as described in Ser. No. 571,510.

Pyrophoric particles having different delay times, e.g., from one second to 30 seconds, can be mixed with each other and with the ignitible substrates, to extend the burning times.

Preformed tubes can also be used to hold the pyrophoric powder. Such tubes can be extruded and then have their wall thickness reduced as by chemical milling.

Raney iron powders such as $FeAl_2$ and $FeAl_3$ are easily boronized by mixing with powdered boron and ammonium chloride, fluoride or borofluoride or the corresponding alkali metal salts, and heating at 750° C. to 1050° C. for 3 to 10 hours in an argon hydrogen atmosphere. The powder particles are preferably smaller than 50 mesh, and the proportion of boron from about 2 to about 110% by weight of the iron in the Raney iron. The ammonium salts act as energizer or activator for the diffusion and so can be present in a concentration of about $\frac{1}{4}$% to about 2% by weight of the total mixture. Other halides and borohalides can be substituted for the ammonium borofluoride.

After the heat treatment is completed and the mixture cooled down, it is in the form of partly sintered-together powder particles that are easily crushed to a fine powder and washed with water to remove remaining energizer leaving a product powder in which each particle has boron diffused into its surface. Where the diffusion heat treatment is sufficiently long and the particles sufficiently small, the boronizing penetrates throughout the depths of the particles.

Before or after the washing to remove the activator, the boronized particles are subjected to the action of aqueous caustic soda or caustic potash to dissolve out some of their aluminum content, leaving a boron-containing activated Raney iron powder. Such leaching also dissolves out any residual diffusion activator. The residual powder is pyrophoric like ordinary Raney iron powder, but liberates more pyrophoric heat and reaches higher temperatures. It can be preserved as by keeping it under water or other liquid so that it is out of contact with the air. For such preservation it is helpful to have stannite ion present in the leaching solution, as disclosed in parent U.S. Pat. No. 4,435,481, and even present in the protecting liquid. Less of the stannite is needed for protecting the powder, than is needed for protecting foils.

According to the present invention pyrophoric Raney iron particles, whether or not they contain diffused-in boron, can be safely stored in air, if they are first brought into good thermal contact with a heat sink at about 35° C. or less and while in such thermal contact exposing them to air or oxygen in such a way that the particles do not increase in temperature by more than about 5° C.

Where the particles are not over about 2 millimeters in size, they can be spread as a single-particle layer on a metal plate, preferably aluminum or copper, at least about 2 millimeters thick, as by pouring into such plate a slurry of the actively pyrophoric particles in water and then permitting the water to evaporate. A stream of air directed at the layer, as by a fan, greatly speeds the evaporation. The resulting particle layer can then remain on the plate exposed to air at 35° C. or less for a few minutes to assure that the water is completely evaporated off and the particles have all been stabilized.

Pyrophoric particles of any size can be similarly stabilized by contacting them with aqueous potassium nitrate for from 1 to 24 hours. At least about 5 grams per liter of such nitrate solution will provide the stabilization after about 20 hours of contact at room temperature. Other nitrates behave similarly, as do nitrites.

Stabilized by either of the foregoing techniques, the particles will not show pyrophoricity if kept in air at about 50° C. or less. However, when heated to about 100° C. or higher, they promptly begin reacting with air and go through a pyrophoric stage to completion. The heat thus generated and the maximum temperature reached in such stage are slightly less than those obtained from unstabilized particles, but more than adequate for most pyrophoric uses. Some of the stabilized products will pyrophorically ignite when heated to temperatures of 90° C. or somewhat below.

To achieve the above-described stabilization the leached iron-boron-aluminum alloy should have at least about 25% boron. An alloy stabilized to 50° C. will show stability to about 70° C. when mixed with the $Ba(NO_3)_2$.

A stabilized pyrophoric iron-aluminum-boron corresonding to $2FeB_2.3AlB_2$ is magnetic and will remain stable even at 90° C. Such a pyrophoric alloy can be made by leaching with caustic soda an alloy of:
 33.9 wt % Fe
 33.3 wt % B
 32.8 wt % Al
 ($FeB.2AlB_2$)
which alloy is not magnetic. Even without leaching, such high-boron alloy decomposes $Ba(NO_3)_2$ very effectively when both are 40 micron particles well mixed and heated to ignition. A hot soldering iron will ignite the mixture or will more rapidly ignite a small amount of igniter mixture of 2 parts by weight stabilized pyrophoric iron powder, and 1 part by weight sodium chlorate powder placed over the $NO_2$-generating composition.

Such a reactive unleached iron-aluminum-boron alloy should have about 25% to 40% boron by weight and about 28% to about 50% aluminum by weight.

Stabilized pyrophoric iron particles containing 6% to 30% diffused-in boron by weight, can be mixed with five to seven times their weight pf powdered anhydrous $Ba(NO_3)_2$ to form a composition that is stable at room temperature, but upon heating reacts to evolve copious quantities of $NO_2$. With less diffused-in boron, the reaction is more difficult to initiate and maintain, but the addition to such a less reactive composition of about 3% to about 10% powdered elemental boron and/or oxidizer such as sodium chlorate, makes its action positive and complete.

All the particles are preferably not over one millimeter in size. The stabilized pyrophoric particles can be as low as one-eighth the weight of the barium nitrate, and preferably no greater than about one-third that weight.

Powdered boron alone will react with $Ba(NO_3)_2$, when heated, and thus liberate $NO_2$, even when mixed in a proportion by weight of one part boron to 16 parts $Ba(NO_3)_2$. Such a mixture has low thermal conductivity, a characteristic that is improved by the use of pyrophoric metals. Non-pyrophoric metals such as zirconium, or coarse iron or nickel powder can also be used.

Substituting anhydrous $Sr(NO_3)_2$ for the barium nitrate in the foregoing compositions gives similar but less vigorous results, even when the oxidizer content is raised to 15%. Anhydrous calcium nitrate produces still less vigorous compositions. Hydrated forms of the foregoing nitrates are somewhat less vigorous in their decomposition, as compared with anhydrous forms. Other nitrates such as ferric nitrate, ferrous nitrate, nickel nitrate, aluminum nitrate, copper nitrate, chromium nitrate, as well as the corresponding nitrites, are similarly decomposed, some with even more vigor than others, whether or not hydrated. Indeed, ferric nitrate in hydrated form can be very effectively decomposed by pyrophoric iron-boron alloy containing as little as 5% boron.

Up to about 15% of iron dust can be added to the foregoing compositions without detracting significantly from their effectiveness or the vigor of the reaction with $Ba(NO_3)_2$, but this reduces the volume of $NO_2$ generated. Such dust should have particles about 10 microns or less in size.

The foregoing $NO_2$-generating pyrophoric particles can be used without being stabilized, but then the compositions are required to be protected against contact with oxygen until the $NO_2$-generation is desired. Such protection can be provided by keeping the reactive compositions in a sealed argon-or nitrogen-filled frangible container that is broken when the $NO_2$ generation is to start. No pre-heating is needed. Such a frangible container can be made of glass or very brittle metal such as iron aluminide, and the breaking of the container can be assisted by a percussion cap or the like.

Pyrophoric nickel powder can be used in the foregoing composition in place of pyrophoric iron powder.

Magnesium powder should not be added to any of the foregoing powdered compositions inasmuch as such addition tends to render the compositions explosive. Thus a mixture by weight of four parts magnesium powder, two parts boron powder and 32 parts anhydrous barium nitrate powder, all particles being smaller than 100 microns, will upon heating violently detonate even if in an open container. Molar proportions of boron:magnesium:nitrate radical of 1:1.2:1.5 plus or minus 25% for each ingredient, are dangerous in this respect.

Boron powder alone will decompose $Ba(NO_3)_2$, and will decompose as much as 16 times its weight of such nitrate, but is difficult to ignite. Adding 5% by weight of pyrophoric Fe-B-Al alloy or even the above-noted active non-pyrophoric Fe-B-Al alloy simplifies the ignition.

Pyrophoric Fe-B-Al alloys containing less than about 4% B will not do a good job of decomposing $Ba(NO_3)_2$ unless at least about 1% elemental B powder is added to the $NO_2$-generating mixture.

The boronized Raney iron particles of the present invention are also effective to decompose polytetrafluoroethylene resin and in the presence of a source of oxygen generate dangerous fluorine-containing gases. Thus, a mixture of powdered polytetrafluoroethylene with about one-eighth its weight of powdered sodium chlorate, and with about one-fourth its weight of powdered Raney iron in which the iron had been diffusion-alloyed with 6% boron, will react and generage large quantities of fluorine-containing gases. Similar results are obtained whether the Raney iron is stabilized or unstabilized, and even if it contains no boron except that when stabilized it will not begin the gas-generating reaction until it is heated to about 110° C.

A composition very effective for decomposing nitrates as well as polytetrafluoroethylene resin is an aluminum-iron-boron alloy containing by weight about 16.9% aluminum and about 13.5% boron. It is essentially $AlFe_2B_2$.

The gas generation is made more vigorous by increasing the boron content of the Raney iron to about 20% or even higher, or by adding up to about 10% elemental finely divided boron to the resin-containing mixture. Mixtures containing more than about 5% free boron or more than about 10% alloyed boron need little or no air or other oxidizer to effect the gas generation.

Other oxidizers such as nitrates, nitrites, $KMnO_4$, sodium perchlorate, manganese dioxide, sodium peroxide, sodium periodate, sodium iodate, sodium bismuthate and $CrO_3$ can be used. Where the resin is in the form of an open-celled foam weighing about 0.15 gram or less per cubic centimeter, no oxidizer is needed inasmuch as sufficient air will be present in the foam cells. The use of shredded foam in such compositions while keeping the compositions open to the air, permits the use of foams having densities as large as 0.2 gram per cubic centimeter, without extra oxidizer.

The boron-containing Raney iron can also be made without a diffusion treatment. For example, a batch of aluminum is melted, and then iron and boron are dissolved in the melt to make $FeAl_2$ containing about 20% boron by weight of the iron. The melt is then solidified, crushed to a powder, and leached to extract most of the aluminum from the powder. The leached product will still contain as much as 25% aluminum by weight, and is highly pyrophoric.

Nickel can be substituted for the iron in the making of a powdered Raney alloy for use in the foregoing oxidative decomposition of polytetrafluoroethylene resin. Such Raney nickel can also contain boron to increase its pyrophoric heat liberation.

Pyrophoric iron and nickel foils can also be stabilized, preferably by suspending them in cold water and bubbling air through the suspension. Such pyrophoric foils can be made on a large scale basis by starting with a commercial aluminum-dipped 3 to 6 mil iron foil containing about 3 mils aluminum on each face, cold reducing the dipped product to about one-third its thickness, and then heating the cold-reduced material at about 600° C. in an aluminum chloride atmosphere for about three hours to yield a product about 1½ to 3 mils thick both surfaces of which are very rich in both aluminum and iron. This product is then leached as indicated above. The aluminum into which the iron foil is dipped can contain up to about 12% silicon, and a dip coating of such aluminum-silicon alloy is less likely to delaminate.

Iron or nickel foil can also be activated by unreeling from a spool and passing it through an aluminizing retort, preferably while holding a wide strip of the foil on its edge so that it is in a vertical plane. The aluminizing is uniform, particularly where the aluminizing is effected with a diffusion powder pack as described in U.S. Ser. No. 172,671. The aluminized foil can then be passed through a leaching tank.

Regardless of how an activated leached iron or nickel surface is obtained, it can be used for many catalytic purposes including the oxidation of methane, and such use is palladium, or a thin layer of fine zirconium oxide powder. Metal films are readily deposited by electroplating or in the case of platinum-family metals by decomposing the chloride or other salt of such metal. Powders can be applied by mixing them with colloidal alumina or silica in suspension in water, then applying the suspension and finally permitting the water to evaporate. The $ZrO_2$ changes the wave length of the radiation emitted when the activated surface pyrophorically reacts.

When diffusion aluminizing thin substrates such as iron foil only a few mils thick for the preparation of a pyrophoric product, the operation can be speeded up by applying the aluminum to the surface of the substrate and intensely heating the substrate to cause the applied aluminum to rapidly diffuse into its interior. When the aluminum is applied in liquid form, even greater speeds are attained. For these thin substrates the diffusion penetration need only be about one or two mils, and at a temperature of about 1500° F. this can be effected in a few minutes.

Thus, a two-mil thick, one-inch wide type 1010 iron foil can be Schoop coated with about a 1½-mil thick layer of molten aluminum as the foil is unwound from a supply coil and passed into an argon box where it is induction heated to about 1400° F. After five minutes of such heating, the foil is ready for the leaching step that renders it highly pyrophoric. The aluminum can alternatively be applied as a dispersion of powder in an aqueous or organic liquid that volatilizes away.

Instead of argon in the box, other protective gases such as nitrogen and hydrogen can be used, as described for example in U.S. Ser. No. 281,405. The foil will begin to deform at about 1900° F., and by keeping within about 500° F. of that softening temperature, the heat treatment can be reduced to about three minutes. The same 500° F. below softening is also effective with other substrates such as nickel that deform at temperatures at least as high as 1500° F.

Electric resistance heating, radiant heating, and even flame heating can be used instead of dielectric heating. Flame heating is preferably applied against the aluminum-coated surface of the foil using a flame fed by a gaseous combustion mixture of hydrogen and oxygen or air containing sufficient oxygen or air to enable suitable combustion, but insufficient to add a significant amount of oxygen to the atmosphere in the box.

The leaching operation can also be speeded up by the presence of a little dissolved tin in the leaching solution. Thus, a 10% aqueous solution of sodium hydroxide containing stannous chloride dissolved in a concentration that provides about 1 gram of tin per liter, will adequately complete leaching at 200° F. in three minutes or even less, of a diffusion-aluminized 2-mil thick iron foil passed through the leaching solution. The tin can be introduced as other compounds such as sodium or potassium stannite or stannate, without significantly affecting the results.

Without the tin, a 3-minute leach will provide only a limited degree of pyrophoricity.

At temperatures below 200° F., longer leaching times are needed to obtain full pyrophoricity, even with the tin. For example, at 140° F. more than ten minutes are needed even if the tin content of the leaching solution is raised to 2 grams per liter.

Optimum leaching results are obtained with sodium hydroxide or potassium hydroxide solutions about 8% to about 15% strong, containing about ½ to about 1½ grams dissolved tin per liter, and at leaching temperatures of about 190° F. to about 215° F. No more than five minutes of such leaching is needed and to this end the aluminum pick-up when diffusion coating a foil should be not over about 11 milligrams per square centimeter of foil face exposed to the aluminizing. The products leached within these ranges have about as much or more pyrophoric heat output as those leached in a 10% NaOH solution containing 2 grams of dissolved tin per liter, at 140° F. for 30 minutes.

The dissolved tin is gradually consumed during the leaching and can be maintained at the specified concentration by periodic or gradual addition of more tin. Using more than 1½ grams dissolved tin in the 200° F. leaching solution doe not help the leaching and is actually undesirable inasmuch as it causes too much tin to transfer into the leached product.

A litter further shortening of the leaching time can be obtained by effecting the leaching with the help of ultrasonic vibration. To illustrate, the insertion of a 50-watt output ultrasonic generator of 20 to 100 kilohertz vibration in the leaching bath will at full output shorten the leaching time about 10%. At least 25 watts of ultrasonic vibration should be used.

Obviously, many modifications and variations of the present invention are possible in the light of the above teachings. It is, therefore, to be understood that within the scope of the appended claims the invention may be practiced otherwise than as specifically described.

What is claimed:

1. In the process of leaching aluminized iron substrates to develop a high degree of pyrophoricity, the improvement according to which the leaching is effected at from about 190° F. to about 215° F. in an aqueous solution of from about 8% to about 15% sodium or potassium hydroxide by weight and from about ½ to about 1½ grams of dissolved tin per liter, and the leaching is terminated after about five minutes.

2. The process of claim 1 in which the leaching action is speeded by the application of ultrasonic vibration.

3. The process of preparing boron-containing pyrophoric iron, in which process Raney iron powder is diffusion boronized in a mixture with powedered boron and a diffusion coating activator, the mixture containing from about 2% to about 110% boron by weight of the iron in the Raney iron, and then the boronized powder is recovered and some of its aluminum is leached from it to develop its pyrophoricity.

4. The process of claim 3 in which the Raney iron powder particles are smaller than about 50 mesh in size 5. The process of claim 3 in which the boronizing is conducted for a time long enough to penetrate throughout the depths of the Raney iron particles.

6. The process is claim in which the leaching is effected with a leaching solution containing sufficient stannite to protect the leached particles.

7. Raney iron powder containing at least 2% boron alloyed with the iron.

8. Pyrophoric Raney iron powder containing about 2% to about 6% boron alloyed with the iron.

9. The process of preparing boron-containing pyrophoric iron powder, in which process aluminum is melted, sufficient iron and boron are dissolved in the melted aluminum to form an alloy that is pyrophoric after some of the aluminum is leached out, the resulting alloy is solidifed, then crushed, and the crushed powder is leached to extract from it sufficient aluminum to render the powder pyrophoric.

* * * * *